(12) United States Patent
Noguchi

(10) Patent No.: US 11,558,028 B2
(45) Date of Patent: Jan. 17, 2023

(54) FILTER MODULE

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 268 days.

(21) Appl. No.: 16/984,189

(22) Filed: Aug. 4, 2020

(65) Prior Publication Data
US 2021/0067128 A1 Mar. 4, 2021

(30) Foreign Application Priority Data
Aug. 28, 2019 (JP) .............................. JP2019-155654

(51) Int. Cl.
*H03H 9/02* (2006.01)
*H03H 7/09* (2006.01)
*H03H 9/64* (2006.01)
*H03H 9/42* (2006.01)
*H03H 9/05* (2006.01)

(52) U.S. Cl.
CPC .......... *H03H 9/02574* (2013.01); *H03H 7/09* (2013.01); *H03H 9/0576* (2013.01); *H03H 9/426* (2013.01); *H03H 9/6433* (2013.01)

(58) Field of Classification Search
CPC .. H03H 9/02574; H03H 9/0576; H03H 9/426; H03H 9/6433; H03H 9/542; H03H 9/6436; H03H 9/6483; H03H 9/706; H03H 9/725; H03H 7/09; H03H 9/0542; H03H 9/205; H03H 3/02
USPC .................. 333/133, 187, 188, 193–196
See application file for complete search history.

(56) References Cited

U.S. PATENT DOCUMENTS

| | | |
|---|---|---|
| 2014/0118084 A1 | 5/2014 | Takemura |
| 2015/0155850 A1* | 6/2015 | Kuzushita ............ H03H 9/0566 333/133 |
| 2017/0126198 A1* | 5/2017 | Mukai .................. H03H 7/0115 |

FOREIGN PATENT DOCUMENTS

WO 2013/008435 A1 1/2013

* cited by examiner

*Primary Examiner* — Samuel S Outten
*Assistant Examiner* — Jorge L Salazar, Jr.
(74) *Attorney, Agent, or Firm* — Keating & Bennett, LLP

(57) ABSTRACT

A filter module includes an inductor, a filter including first wiring, and second wiring between the inductor and the first wiring and being a direct-current floating potential. The inductor and the first wiring are magnetically coupled, the inductor and the second wiring are magnetically coupled, and the first wiring and the second wiring are capacitively coupled.

14 Claims, 8 Drawing Sheets

FILTER MODULE

CROSS REFERENCE TO RELATED APPLICATIONS

This application claims the benefit of priority to Japanese Patent Application No. 2019-155654 filed on Aug. 28, 2019. The entire contents of this application are hereby incorporated herein by reference.

BACKGROUND OF THE INVENTION

1. Field of the Invention

The present invention relates to a filter module including a filter.

2. Description of the Related Art

A circuit module including a filter and an inductor (matching circuit) is disclosed, for example, in International Publication No. 2013/008435. When the inductor and the filter are positioned closely, the inductor and wiring included in the filter are magnetically coupled, and there is degradation in attenuation characteristics of the filter caused by a high-frequency component arising from that magnetic coupling. In that case, when shield wiring connected to a ground is arranged between the inductor and the filter, the inductor and the shield wiring are magnetically coupled, and the high-frequency component arising from the magnetic coupling can escape to the ground, whereas the inductor and the wiring included in the filter are unlikely to be magnetically coupled because the shield wiring is arranged therebetween, and the degradation in attenuation characteristics of the filter can be suppressed.

Even in the case where the shield wiring is arranged between the inductor and the filter, however, the inductor and the wiring included in the filter are magnetically coupled in significant quantities, and the high-frequency component arising from that magnetic coupling degrades the attenuation characteristics of the filter.

SUMMARY OF THE INVENTION

Preferred embodiments of the present invention provide filter modules each including a filter having improved attenuation characteristics.

According to a preferred embodiment of the present invention, a filter module includes an inductor, a filter including first wiring, and second wiring between the inductor and the first wiring and having a direct-current floating potential. The inductor and the first wiring are magnetically coupled, the inductor and the second wiring are magnetically coupled, and the first wiring and the second wiring are capacitively coupled.

Preferred embodiments of the present invention provide filter modules each including a filter having improved attenuation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
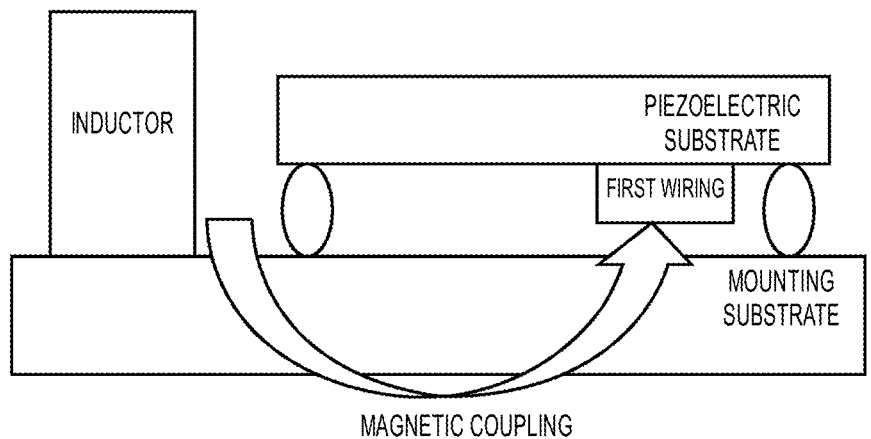
FIG. 1 schematically illustrates a state in which an inductor and a first wiring are magnetically coupled.

Preferred embodiments of the present invention are described in detail below with reference to the drawings. The preferred embodiments described below indicate comprehensive or specific examples. The numerical values, shapes, materials, elements, arrangement and topology of the elements, and the like illustrated in the preferred embodiments below are examples and are not intended to limit the present invention. Among the elements in the preferred embodiments described below, elements not described in an independent claim are described as optional elements. The sizes of the elements illustrated in the drawings or the ratios of the sizes may not necessarily be precise. In the drawings, the same reference numerals are used to describe the same or substantially the same configurations, and overlapping description may be omitted or shortened. In the preferred embodiments described below, "connected" includes not only a directly connected state but also an electrically connected state with other intervening devices, elements, or the like.

First, the logic according to preferred embodiments of the present invention is described with reference to FIGS. 1 to 3.

FIG. 1 schematically illustrates a state in which an inductor and first wiring are magnetically coupled.

Figure 2:
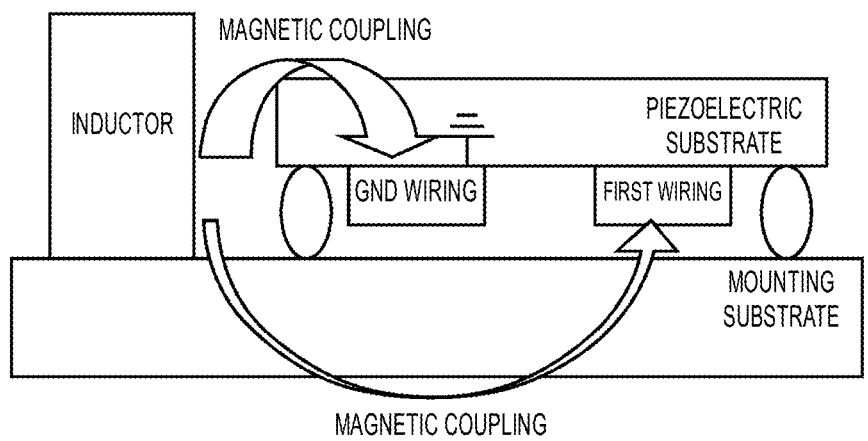
FIG. 2 schematically illustrates a state in which the inductor and the first wiring are magnetically coupled and the inductor and ground wiring are magnetically coupled.

FIG. 2 schematically illustrates a state in which the inductor and the first wiring are magnetically coupled and the inductor and ground wiring are magnetically coupled.

Figure 3:
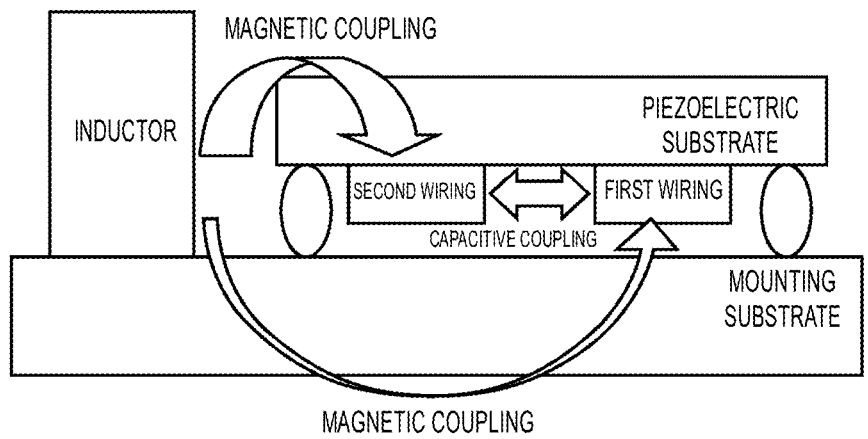
FIG. 3 schematically illustrates a state in which the inductor and the first wiring are magnetically coupled, the inductor and second wiring are magnetically coupled, and the first wiring and the second wiring are capacitively coupled.

FIG. 3 schematically illustrates a state in which the inductor and the first wiring are magnetically coupled, the inductor and second wiring are magnetically coupled, and the first wiring and the second wiring are capacitively coupled.

FIGS. 1 to 3 are side views of a filter module including a filter and the inductor. The filter includes a piezoelectric substrate, and the first wiring included in the filter is disposed on the piezoelectric substrate. The inductor and the piezoelectric substrate are mounted on a mounting substrate. In FIG. 2, the ground wiring is disposed on the piezoelectric substrate. In FIG. 3, the second wiring is disposed on the piezoelectric substrate.

As illustrated in FIG. 1, a magnetic flux from the inductor is coupled to the first wiring. The first wiring is signal wiring that allows high-frequency signals passing through the filter to flow therethrough (also referred to as hot wiring). Thus, the inductor and the first wiring are magnetically coupled, the first wiring is affected by the magnetic flux from the inductor, and the attenuation characteristics of the filter deteriorate.

In the circuit module described in International Publication No. 2013/008435, as illustrated in FIG. 2, the wiring is arranged between the inductor and the first wiring. To that wiring, the major portion of the magnetic flux from the inductor is coupled. That wiring is connected to a ground and defines and functions as ground wiring, and the high-frequency component arising from magnetic coupling between the inductor and the ground wiring can escape to the ground, whereas the inductor and the first wiring are unlikely to be magnetically coupled because the shield wiring is provided therebetween. Even in the case where the ground wiring is provided between the inductor and the first wiring, however, the inductor and the first wiring are magnetically coupled in significant quantities, and the high-frequency component arising from that magnetic coupling degrades the attenuation characteristics of the filter.

In contrast, in preferred embodiments of the present invention, as illustrated in FIG. 3, the wiring provided between the inductor and the first wiring is second wiring not connected to the ground and having a direct-current floating potential, and the first wiring and the second wiring are capacitively coupled. The state where the second wiring is a direct-current floating potential means that the second wiring is not linked to the ground but is linked to a capacitance. By adjusting the capacitance in the capacitive coupling, the phase and amplitude of the high-frequency component arising from the magnetic coupling between the inductor and the second wiring can be adjusted, the high-frequency component with the adjusted phase and amplitude can cancel the high-frequency component arising from the magnetic coupling between the inductor and the first wiring, and the attenuation characteristics of the filter can be improved by using the high-frequency components.

Preferred embodiments that obtain a state where the inductor and the first wiring are magnetically coupled, the inductor and the second wiring are magnetically coupled, and the first wiring and the second wiring are capacitively coupled, as illustrated in FIG. 3, are described below.

First Preferred Embodiment

A filter module according to a first preferred embodiment of the present invention is described with reference to FIGS. 4 to 8.

Figure 4:
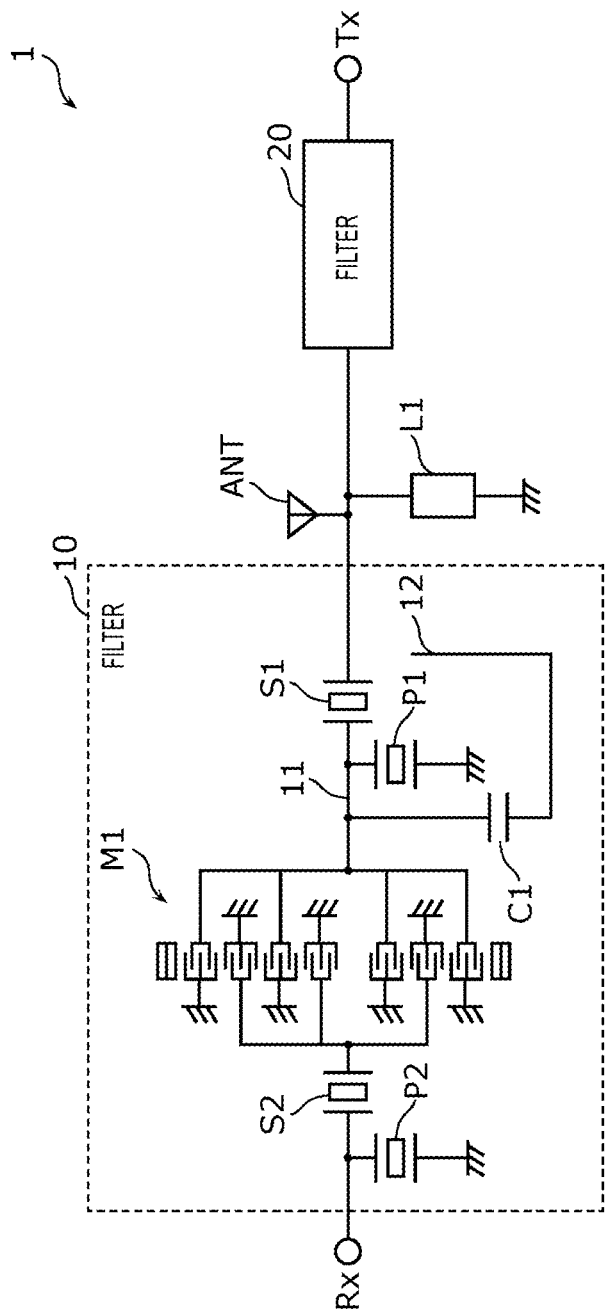
FIG. 4 illustrates an example circuit configuration of a filter module according to a first preferred embodiment of the present invention.

FIG. 4 illustrates an example circuit configuration of a filter module 1 according to the first preferred embodiment.

The filter module 1 includes a filter 10, a filter 20, an inductor L1, and an antenna ANT. The filter module 1 may not include the antenna ANT. The antenna ANT may be provided as a different unit from the filter module 1.

The filter module 1 includes a plurality of filters including the filter 10 (here, filters 10 and 20), and input terminals or output terminals of the plurality of filters are connected to a common terminal. One example of the common terminal, which is not clearly illustrated in FIG. 4, may be a node connecting a path linking the filters 10 and 20 and the antenna ANT. The filters 10 and 20 are connected to the common terminal and define a multiplexer (here, duplexer).

One example of the filter 10 may be a reception filter that allows high-frequency reception signals received at the antenna ANT to be transferred to, for example, a radio frequency integrated circuit (RFIC) or the like through an Rx terminal. One example of the filter 20 may be a transmission filter that allows high-frequency transmission signals received from, for example, an RFIC or the like through a Tx terminal to be transferred to the antenna ANT, which can transmit the high-frequency transmission signals. The antenna ANT can transmit and receive high-frequency signals, and one example of the antenna ANT may be a multiband antenna compliant with a communication standard, such as long term evolution (LTE). For example, the antenna ANT may transmit and receive high-frequency signals in LTE Band 26.

One example of the filter 10 may be a filter with a pass band of Band 26 Rx (about 859 MHz-about 894 MHz), and Band 26 Tx (about 814 MHz-about 849 MHz) may be an attenuation band for that filter. One example of the filter 20 may be a filter with a pass band of Band 26 Tx (about 814 MHz-about 849 MHz), and Band 26 Rx (about 859 MHz-about 894 MHz) may be an attenuation band for that filter.

The inductor L1 is a matching circuit to match impedance of the antenna ANT and impedance of the filter 10 and is connected to the antenna ANT and the filter 10. Magnetic coupling of the inductor L1 and first wiring 11, which is described below, degrades the attenuation characteristics of the filter 10.

The following focuses on the filter 10 to which a preferred embodiment of the present invention is applied, describes the configuration for improving the attenuation characteristics of the filter 10, and omits the detailed description of the filter 20.

The filter 10 includes series arm resonators S1 and S2, parallel arm resonators P1 and P2, a longitudinally coupled resonator M1, and a capacitor C1.

Examples of each of the series arm resonators S1 and S2 and the parallel arm resonators P1 and P2 and each of the resonators defining the longitudinally coupled resonator M1 may include a surface acoustic wave (SAW) resonator or an acoustic wave resonator using a bulk acoustic wave (BAW). Examples of the SAW may include a surface wave, a Love wave, a Leaky wave, a Rayleigh wave, a boundary wave, a leaky SAW, a pseudo SAW, and a plate wave.

The series arm resonators S1 and S2 and the longitudinally coupled resonator M1 are connected in series in the path linking the antenna ANT and the Rx terminal. The parallel arm resonator P1 is connected between the ground and a node in the above-described path between the series arm resonator S1 and the longitudinally coupled resonator M1. The parallel arm resonator P2 is connected between the ground and a node in the above-described path between the series arm resonator S2 and the Rx terminal.

In the above-described configuration of the filter 10, the series arm resonators S1 and S2 and the longitudinally coupled resonator M1 including acoustic wave resonators are arranged in the series arm path, and the parallel arm resonators P1 and P2 including acoustic wave resonators are arranged in the parallel arm path. Therefore, an acoustic wave filter with a low-loss pass band and a steep transition band from the pass band to an attenuation band can be achieved.

For example, wiring that connects the series arm resonator S1 and the longitudinally coupled resonator M1 and through which high-frequency signals passing through the filter 10 flows is the first wiring 11 included in the filter 10. Wiring arranged between the inductor L1 and the first wiring 11 is second wiring 12. The inductor L1 and the first wiring 11 are magnetically coupled, and the inductor L1 and the second wiring 12 are magnetically coupled. The first wiring 11 and the second wiring 12 are capacitively coupled. Specifically, the first wiring and the second wiring 12 are capacitively coupled with the capacitor C1 disposed therebetween.

Figure 5:
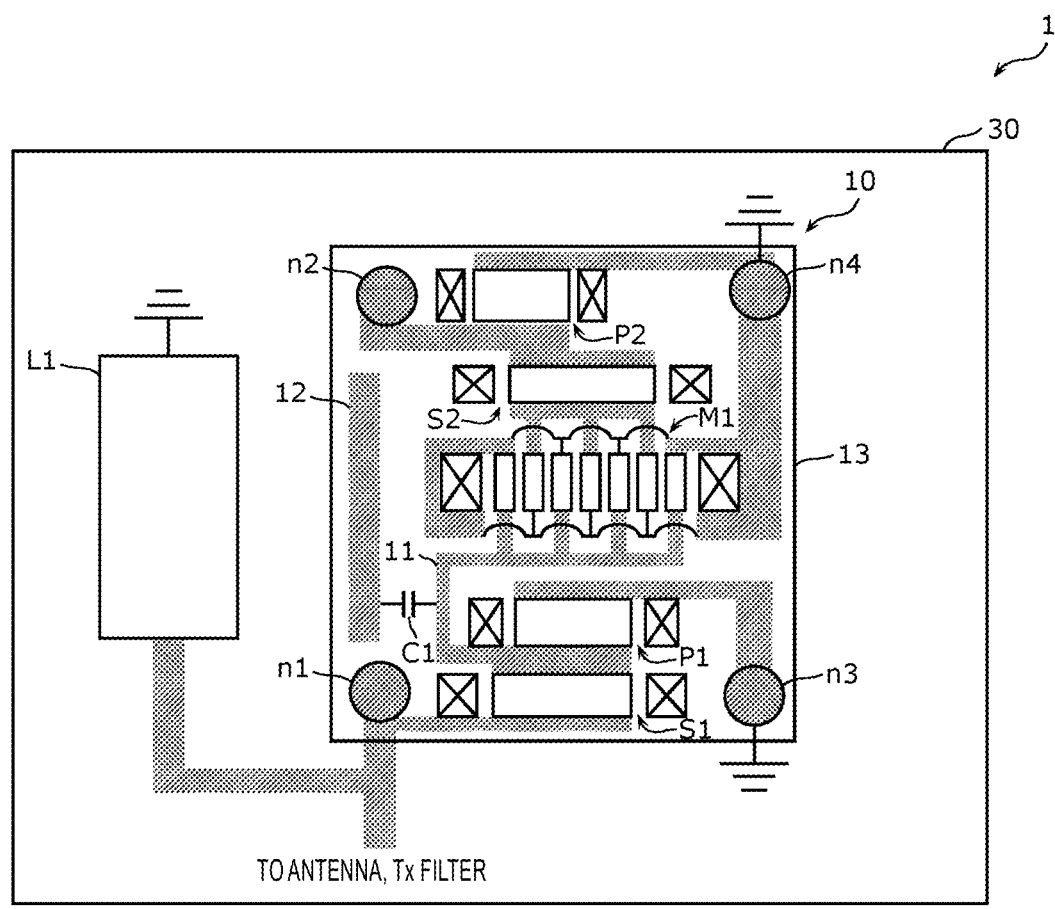
FIG. 5 illustrates an example substrate layout of the filter module according to the first preferred embodiment of the present invention.

FIG. 5 illustrates an example substrate layout of the filter module 1 according to the first preferred embodiment. As illustrated in FIG. 5, one example of the filter module 1 may include a mounting substrate 30 and a piezoelectric substrate 13. FIG. 5 is a plan view of the mounting substrate 30 and the piezoelectric substrate 13. The piezoelectric substrate 13 defines the filter 10. The inductor L1 and the piezoelectric substrate 13 are mounted on the mounting substrate 30.

One example of the piezoelectric substrate 13 may be mounted on the mounting substrate 30 with bumps n1 to n4 disposed therebetween. The bump n1 is an antenna bump and is connected to the antenna ANT and the filter 20 (Tx filter) with the wiring on the mounting substrate 30 disposed therebetween. Although not illustrated in FIG. 5, the antenna ANT and the filter 20 may be disposed on the mounting substrate 30 or outside the mounting substrate 30. The bump n2 is connected to the Rx terminal with the mounting substrate 30 disposed therebetween. The bumps n3 and n4 are connected to a common ground on the mounting substrate 30 and function as ground terminals.

Interdigital transducer (IDT) electrodes including a plurality of electrode fingers and defining the pass band of the filter 10 are disposed on the piezoelectric substrate 13. Specifically, the IDT electrodes on the piezoelectric substrate 13 define the series arm resonators S1 and S2, the parallel arm resonators P1 and P2, and the longitudinally coupled resonator M1. In FIG. 5, for each of the series arm resonators S1 and S2, the parallel arm resonators P1 and P2, and the longitudinally coupled resonator M1, the plurality of electrode fingers of the IDT electrode are depicted as a rectangle, and reflectors sandwiching the IDT electrode are depicted as rectangles with crosses.

One example of the inductor L1 may be a chip inductor mounted on the mounting substrate 30. The inductor L1 is not limited to the chip inductor and may be a wiring pattern disposed on the mounting substrate 30 or on an inner layer therein. The first wiring 11 and the second wiring 12 provided in the vicinity of the inductor L1 are affected by a magnetic flux from the inductor L1, the inductor L1 and the first wiring 11 are magnetically coupled, and the inductor L1 and the second wiring 12 are magnetically coupled.

The second wiring 12 is provided on an end portion of the piezoelectric substrate 13 near the inductor L1. Therefore, the effect of the magnetic flux from the inductor L1 on the second wiring 12 is stronger than that on the first wiring 11. The second wiring 12 is a direct-current floating potential. For example, the second wiring 12 is connected to the first wiring 11 with the capacitor C1 disposed therebetween, but is not connected to other wiring, a device, a power source, or a ground, or the like on the piezoelectric substrate 13 or the mounting substrate 30, or the like.

As is also illustrated in FIG. 4, the first wiring 11 and the second wiring 12 are capacitively coupled with the capacitor C1 disposed therebetween. One example of the capacitor C1 may be a comb-shaped capacitive electrode including a plurality of electrode fingers, and the direction in which the plurality of electrode fingers in the comb-shaped capacitive electrode extend may intersect with the direction in which the plurality of electrode fingers in the IDT electrodes defining the pass band of the filter 10 extend. Thus, the effect of the comb-shaped capacitive electrode (capacitor C1) on an acoustic wave propagating through the IDT electrode can be avoided while at the same time the capacitor C1 can also be disposed on the piezoelectric substrate 13 defining the filter 10. The direction in which the plurality of electrode fingers in the IDT electrodes extend and the direction in which the plurality of electrode fingers in the comb-shaped capacitive electrode extend may be parallel or substantially parallel to each other, for example. The state of being substantially parallel described here is not intended to be limited to a state of being exactly parallel, and it may be a state of deviating by approximately ±10 degrees from the state where the direction in which the plurality of electrode fingers in the IDT electrodes extend and the direction in which the plurality of electrode fingers in the comb-shaped capacitive electrode extend are exactly parallel to each other. In that case, the electrode finger pitch in the IDT electrode and that in the comb-shaped capacitive electrode are mutually different. This is because the different electrode finger pitches can also enable reducing or preventing the effect of the comb-shaped capacitive electrode on an acoustic wave propagating through the IDT electrode.

The first wiring 11 and the second wiring 12 are parallel or substantially parallel to each other. The state of being substantially parallel described here is not intended to be limited to a state of being exactly parallel. For example, the first wiring 11 and the second wiring 12 may deviate by approximately ±10 degrees from the state where the first wiring 11 and the second wiring 12 are exactly parallel to each other. When the first wiring 11 and the second wiring 12 are parallel or substantially parallel to each other, the capacitive coupling of the first wiring 11 and the second wiring 12 is strong. By adjusting the positional relationship between the first wiring 11 and the second wiring 12, the adjustment of the capacitance in the capacitive coupling of the first wiring 11 and the second wiring 12 can be facilitated.

The first wiring 11 and the second wiring 12 are capacitively coupled such that the high-frequency component arising from the magnetic coupling of the inductor L1 and the first wiring 11 and the high-frequency component arising from the magnetic coupling of the inductor L1 and the second wiring 12 have opposite phases. The opposite phases described here is not intended to be limited to the state where the phase difference is exactly 180 degrees. For example, the opposite phases may include the state where the phase difference is in the range of about 170 degrees to about 190 degrees. The first wiring 11 and the second wiring 12 are capacitively coupled such that the amplitude of the high-frequency component arising from the magnetic coupling of the inductor L1 and the first wiring 11 and the amplitude of the high-frequency component arising from the magnetic coupling of the inductor L1 and the second wiring 12 are the same or approximately the same.

For example, the above-described phase and amplitude can be adjusted by the adjustment of the capacitance of the capacitor C1 or the adjustment of the positional relationship between the first wiring 11 and the second wiring 12. Thus, the high-frequency component arising from the magnetic coupling of the inductor L1 and the second wiring 12 and having the phase and amplitude adjusted by the capacitive coupling of the first wiring 11 and the second wiring 12 can be intentionally coupled to the high-frequency component arising from the magnetic coupling of the inductor L1 and the first wiring 11. Accordingly, the high-frequency component with the adjusted phase and amplitude can cancel the high-frequency component arising from the magnetic coupling of the inductor L1 and the first wiring 11, the attenuation characteristics of the filter 10 can even be improved by using the high-frequency components, and the filter 10 can have the improved attenuation characteristics. Specific advantages provided by the inclusion of the second wiring 12, which is capacitively coupled to the first wiring 11 and is a direct-current floating potential, are described next with reference to FIG. 6.

Figure 6:
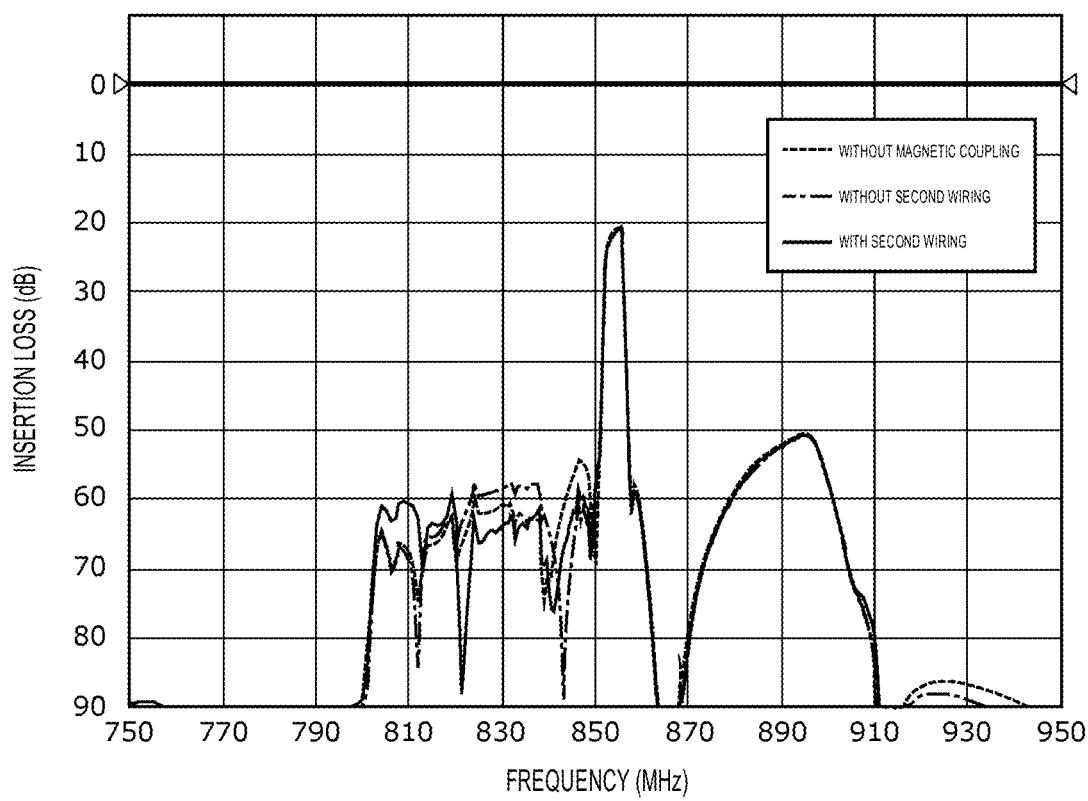
FIG. 6 illustrates example isolation characteristics of the filter module according to the first preferred embodiment of the present invention.

FIG. 6 illustrates example isolation characteristics of the filter module 1 according to the first preferred embodiment. Specifically, FIG. 6 illustrates the isolation characteristics between the Rx terminal and the Tx terminal in FIG. 4 in the frequency range of Band 26 and its vicinity. The broken line indicates the isolation characteristics in an ideal case where the inductor L1 and the first wiring 11 are not magnetically coupled, the dot-dash line indicates the isolation characteristics in a case where the second wiring 12 is not included, and the solid line indicates the isolation characteristics in a case where the second wiring 12 is included. In the case where the second wiring 12 is included, the capacitance of the capacitive coupling of the first wiring 11 and the second wiring 12 is adjusted so as to improve the attenuation characteristics of the filter 10 in the frequency range of Band 26 Tx (that is, the pass band of the filter 20).

In the case where the second wiring 12 is not included, it is revealed that the isolation characteristics in the frequency range of Band 26 Tx (about 814 MHz-about 849 MHz) are worse than those in the ideal case because of the magnetic coupling of the inductor L1 and the first wiring 11. In contrast, in the case where the second wiring 12 is included, it is revealed that the isolation characteristics in the frequency range of Band 26 Tx (about 814 MHz-about 849 MHz) are even better than those in the ideal case because the high-frequency component arising from the magnetic coupling of the inductor L1 and the second wiring 12 and the high-frequency component arising from the magnetic coupling of the inductor L1 and the first wiring 11 are intentionally coupled so as to improve the attenuation characteristics of the filter 10.

As described above, the filter module 1 includes the inductor L1, the filter 10 including the first wiring 11, and the second wiring 12 disposed between the inductor L1 and the first wiring 11 and being a direct-current floating potential. The inductor L1 and the first wiring 11 are magnetically coupled, the inductor L1 and the second wiring 12 are magnetically coupled, and the first wiring 11 and the second wiring 12 are capacitively coupled. Specifically, the first wiring 11 and the second wiring may be capacitively coupled such that the high-frequency component arising from the magnetic coupling of the inductor L1 and the first wiring 11 and the high-frequency component arising from the magnetic coupling of the inductor L1 and the second wiring 12 have opposite phases.

In this configuration, the phase and amplitude of the high-frequency component arising from the magnetic coupling of the inductor L1 and the second wiring 12 can be adjusted by the adjustment of the capacitance in the capacitive coupling of the first wiring 11 and the second wiring 12, the high-frequency component with the adjusted phase and amplitude can cancel the high-frequency component arising from the magnetic coupling of the inductor L1 and the first wiring 11, and the attenuation characteristics of the filter 10 can even be improved by using the high-frequency components. Consequently, because the second wiring 12, which is disposed between the inductor L1 and the first wiring 11 and is a direct-current floating potential, is included and the first wiring 11 and the second wiring 12 are capacitively coupled, the attenuation characteristics of the filter 10 can be improved.

The first wiring 11 and the second wiring 12 may be capacitively coupled with the capacitor C1 disposed therebetween.

As described above, the capacitive coupling of the first wiring 11 and the second wiring 12 can be achieved by using the capacitor C1 (device). By adjusting the capacitance of the capacitor C1, the adjustment of the capacitance of the capacitive coupling of the first wiring 11 and the second wiring 12 can be facilitated.

The piezoelectric substrate 13 may define the filter 10, the IDT electrodes including the plurality of electrode fingers and defining the pass band of the filter 10 may be disposed on the piezoelectric substrate 13, the capacitor C1 may be the comb-shaped capacitive electrode including the plurality of electrode fingers, and the direction in which the plurality of electrode fingers in the IDT electrodes extend and the direction in which the plurality of electrode fingers in the comb-shaped capacitive electrode extend may intersect with each other. Alternatively, the piezoelectric substrate 13 may define the filter 10, the IDT electrodes including the plurality of electrode fingers and defining the pass band of the filter 10 may be disposed on the piezoelectric substrate 13, the capacitor C1 may be the comb-shaped capacitive electrode including the plurality of electrode fingers, the direction in which the plurality of electrode fingers in the IDT electrodes extend and the direction in which the plurality of electrode fingers in the comb-shaped capacitive electrode extend may be parallel or substantially parallel to each other, and the electrode finger pitch in the IDT electrodes and the electrode finger pitch in the comb-shaped capacitive electrode may be mutually different.

In this configuration, the capacitor C1 can also be disposed on the piezoelectric substrate 13 defining the filter 10 and on which the IDT electrodes are disposed, and the filter module 1 can be miniaturized.

The first wiring 11 and the second wiring 12 may also be parallel or substantially parallel to each other.

In this configuration, the capacitive coupling of the first wiring 11 and the second wiring 12 can be strong, and the adjustment of the capacitance in the capacitive coupling of the first wiring 11 and the second wiring 12 can be facilitated.

The filter module 1 may further include the mounting substrate 30, the piezoelectric substrate 13 may define the filter 10, the inductor L1 and the piezoelectric substrate 13 may be mounted on the mounting substrate 30, and the second wiring 12 may be provided on an end portion of the piezoelectric substrate 13 near the inductor L1.

In this configuration, the second wiring 12 can be easily disposed between the first wiring 11 and the inductor L1.

The filter module 1 may further include the plurality of filters including the filter 10, and the input terminals or the output terminals of the plurality of filters may be connected to the common terminal.

In this configuration, for example, the attenuation characteristics of the filter 10 in the range corresponding to the pass band of the filter 20 among the plurality of filters connected to the common terminal can be improved, and this can enable improvement in isolation characteristics of the filter 10 and the filter 20 defining the multiplexer.

In the first preferred embodiment, the example in which the first wiring 11 and the second wiring 12 are capacitively coupled with the single capacitor C1 disposed therebetween is illustrated. The first wiring 11 and the second wiring 12 may be capacitively coupled at a plurality of locations with a plurality of capacitors disposed therebetween. Such an example is illustrated below as a variation of the first preferred embodiment with reference FIGS. 7 and 8.

Figure 7:
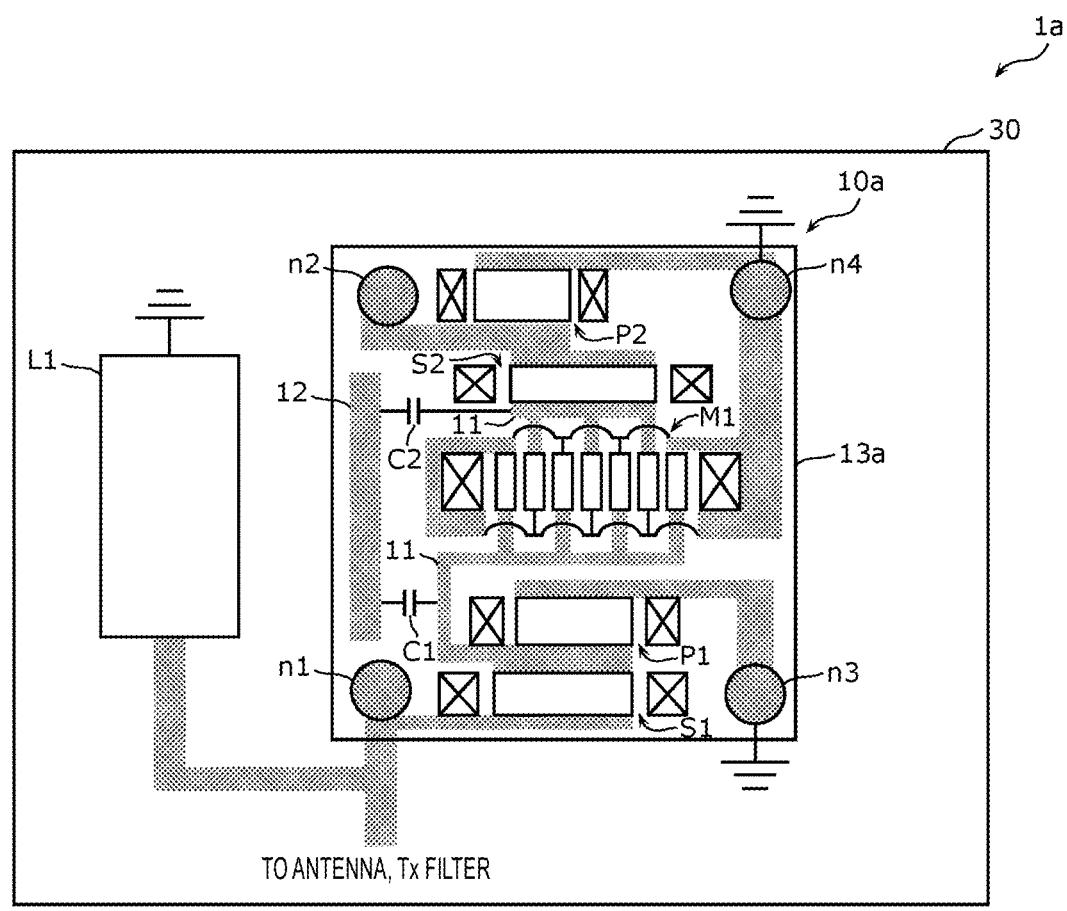
FIG. 7 illustrates an example substrate layout of a filter module according to a variation of the first preferred embodiment of the present invention.

FIG. 7 illustrates an example substrate layout of a filter module 1a according to the variation of the first preferred embodiment. The variation of the first preferred embodiment differs from the first preferred embodiment in that it includes a capacitor C2. Correspondingly, in the variation of the first preferred embodiment, the filter 10 is renumbered as a filter 10a, and the piezoelectric substrate 13 is renumbered as a piezoelectric substrate 13a. The other points are the same as or similar to those in the first preferred embodiment and are not described below.

In the first preferred embodiment, the path linking the series arm resonator S1 and the longitudinally coupled resonator M1 is the first wiring 11. The first wiring 11 may be any other wiring that allows high-frequency signals passing through the filter 10 to flow therethrough. For example, the path linking the series arm resonator S2 and the longitudinally coupled resonator M1 may also be the first wiring 11. As illustrated in FIG. 7, in the path linking the series arm resonator S1 and the longitudinally coupled resonator M1, the first wiring 11 and the second wiring 12 may be capacitively coupled with the capacitor C1 disposed therebetween, and in the path linking the series arm resonator S2 and the longitudinally coupled resonator M1, the first wiring 11 and the second wiring 12 may be capacitively coupled with the capacitor C2 disposed therebetween. One example of the capacitor C2 may be a comb-shaped capacitive electrode including a plurality of electrode fingers disposed on the piezoelectric substrate 13a. Advantages obtained from this configuration in which the first wiring 11 and the second wiring 12 are capacitively coupled at the plurality of locations with the plurality of capacitors disposed therebetween are described next with reference to FIG. 8.

Figure 8:
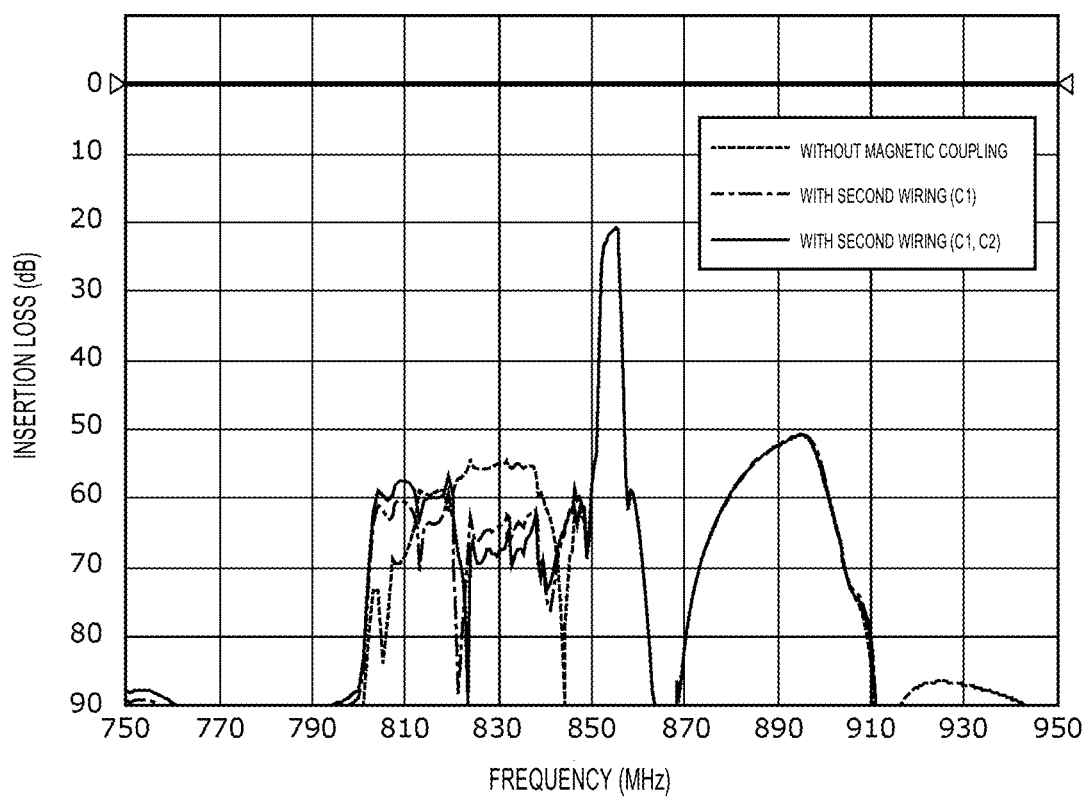
FIG. 8 illustrates example isolation characteristics of the filter module according to the variation of the first preferred embodiment of the present invention.

FIG. 8 illustrates example isolation characteristics of the filter module 1a according to the variation of the first preferred embodiment. The broken line indicates the isolation characteristics in an ideal case where the inductor L1 and the first wiring 11 are not magnetically coupled, the dot-dash line indicates the isolation characteristics in a case where the second wiring 12 connected to the single capacitor C1 is included, and the solid line indicates the isolation characteristics in a case where the second wiring 12 connected to the two capacitors C1 and C2 is included. In the cases where the second wiring 12 is included, the capacitance of the capacitive coupling of the first wiring 11 and the second wiring 12 is adjusted so as to improve the attenuation characteristics of the filter 10a in the frequency range of Band 26 Tx (that is, the pass band of the filter 20).

It is revealed that in the case where the second wiring 12 connected to the two capacitors C1 and C2 is included, more sophisticated coupling of the high-frequency component arising from the magnetic coupling of the inductor L1 and the second wiring and the high-frequency component arising from the magnetic coupling of the inductor L1 and the first wiring 11 can be obtained so as to improve the attenuation characteristics of the filter 10a, the isolation characteristics in the frequency range of Band 26 Tx (about 814 MHz-about 849 MHz) is better than those in the case where the second wiring 12 connected to the single capacitor C1 is included.

Second Preferred Embodiment

In the first preferred embodiment and its variation, the examples in which the first wiring 11 and the second wiring 12 are capacitively coupled with the capacitor(s) (device(s)) disposed therebetween are illustrated. The first wiring 11 and the second wiring 12 may be capacitively coupled with parasitic capacitance. This configuration is described next with reference to FIGS. 9 and 10.

Figure 9:
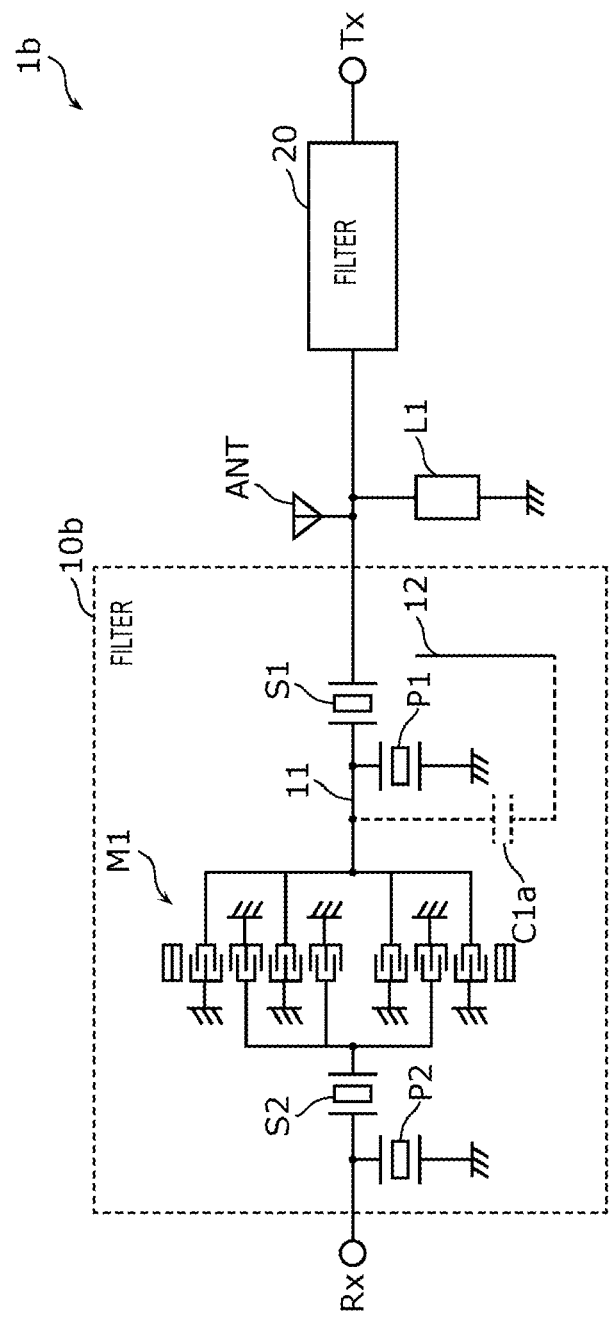
FIG. 9 illustrates an example circuit configuration of a filter module according to a second preferred embodiment of the present invention.
Figure 10:
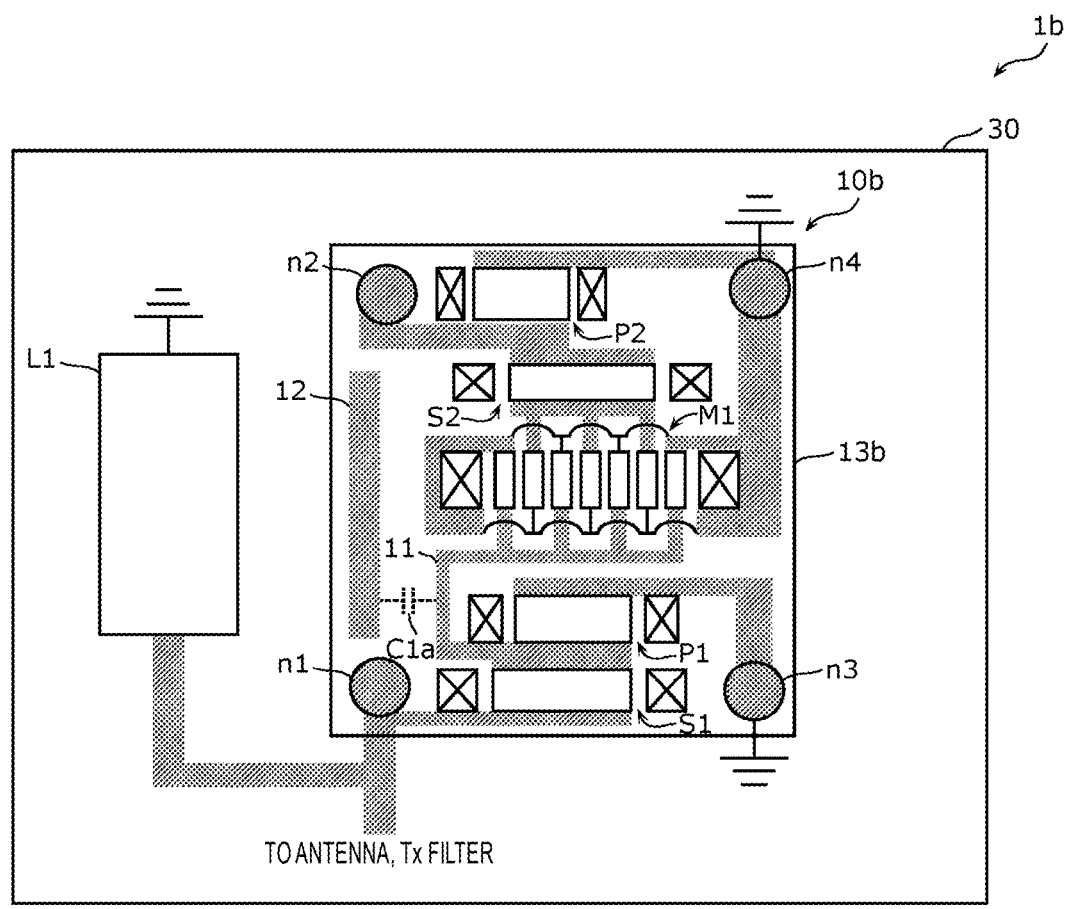
FIG. 10 illustrates an example substrate layout of the filter module according to the second preferred embodiment of the present invention.

FIG. 9 illustrates an example circuit configuration of a filter module 1b according to a second preferred embodiment of the present invention. FIG. 10 illustrates an example substrate layout of the filter module 1b according to the second preferred embodiment. The second preferred embodiment differs from the first preferred embodiment in that it does not include the capacitor C1 and parasitic capacitance C1a is provided instead.

Correspondingly, in the second preferred embodiment, the filter 10 is renumbered as a filter 10b, and the piezoelectric substrate 13 is renumbered as a piezoelectric substrate 13b. The other points are the same as or similar to those in the first preferred embodiment and are not described below.

As illustrated in FIGS. 9 and 10, the second wiring 12 is not connected to the first wiring 11 with the capacitor (device) disposed therebetween and is floating wiring, which is not connected to other device or wiring. The parasitic capacitance C1a exists between the first wiring 11 and the second wiring 12, and the first wiring 11 and the second wiring 12 are capacitively coupled with the parasitic capacitance C1a disposed therebetween. Although the parasitic capacitance C1a is invisible in actuality, it is schematically indicated with the broken line in FIGS. 9 and 10. In that way, when the first wiring 11 and the second wiring are not capacitively coupled with the capacitor (device) disposed therebetween, the first wiring 11 and the second wiring 12 can be capacitively coupled by using the parasitic capacitance C1a.

As described above, the first wiring 11 and the second wiring 12 may be capacitively coupled with the parasitic capacitance C1a disposed therebetween.

Thus, the capacitive coupling of the first wiring 11 and the second wiring 12 can be achieved by using the parasitic capacitance C1a. By adjusting the positional relationship between the first wiring 11 and the second wiring 12, the capacitance in the capacitive coupling of the first wiring 11 and the second wiring 12 can be adjusted, the high-frequency component with the adjusted phase and amplitude can cancel the high-frequency component arising from the magnetic coupling of the inductor L1 and the first wiring 11, and the attenuation characteristics of the filter 10b can even be improved by using the high-frequency components.

The filter modules according to the present invention are described above with reference to the preferred embodiments. The present invention is not limited to the above-described preferred embodiments. The present invention also includes other preferred embodiments achieved by combining any elements in the above-described preferred embodiments, variations obtained by making various modifications conceivable by a person skilled in the art on the above-described preferred embodiments within a range that does not depart from the scope of the present invention, and various kinds of equipment incorporating the filter modules according to the present invention.

For example, in the above-described preferred embodiments, the capacitors C1 and C2 are described as being disposed on the piezoelectric substrate. The present invention is not limited to those examples. For example, the capacitors C1 and C2 may be disposed on the mounting substrate 30. In that case, the capacitors C1 and C2 may not be comb-shaped capacitive electrodes.

For example, in the above-described preferred embodiments, the first wiring 11 and the second wiring 12 are described as being parallel or substantially parallel to each other. The present invention is not limited to those examples. For example, the first wiring 11 and the second wiring 12 may not be parallel or substantially parallel to each other.

For example, in the above-described preferred embodiments, the second wiring 12 is described as being provided on the end portion of the piezoelectric substrate near the inductor L1. The second wiring 12 may be provided in any locations between the inductor L1 and the first wiring 11 on the piezoelectric substrate.

For example, in the above-described preferred embodiments, the second wiring 12 is described as being disposed on the piezoelectric substrate. The present invention is not limited to those examples. For example, the second wiring 12 may be disposed on the mounting substrate 30.

Preferred embodiments of the present invention can be widely used in communication equipment, such as mobile phones, for example, that include a filter module capable of supporting a plurality of wireless frequency ranges.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter module comprising:
an inductor;
a filter including first wiring; and
second wiring between the inductor and the first wiring; wherein
the second wiring is a direct-current floating potential;
the inductor and the first wiring are magnetically coupled, and the inductor and the second wiring are magnetically coupled; and
the first wiring and the second wiring are capacitively coupled such that a high-frequency component generated from the magnetic coupling of the inductor and the first wiring and a high-frequency component generated from the magnetic coupling of the inductor and the second wiring have opposite phases.

2. The filter module according to claim 1, wherein the first wiring and the second wiring are capacitively coupled with a capacitor disposed therebetween.

3. The filter module according to claim 2, wherein
the filter includes a piezoelectric substrate;
an interdigital transducer (IDT) electrode including a plurality of electrode fingers and defining a pass band of the filter is disposed on the piezoelectric substrate;
the capacitor is a comb-shaped capacitive electrode including a plurality of electrode fingers; and
a direction in which the plurality of electrode fingers in the IDT electrode extend and a direction in which the plurality of electrode fingers in the comb-shaped capacitive electrode extend intersect with each other.

4. The filter module according to claim 2, wherein
the filter includes a piezoelectric substrate;
an IDT electrode including a plurality of electrode fingers and defining a pass band of the filter is disposed on the piezoelectric substrate;
the capacitor is a comb-shaped capacitive electrode including a plurality of electrode fingers;
a direction in which the plurality of electrode fingers in the IDT electrode extend and a direction in which the plurality of electrode fingers in the comb-shaped capacitive electrode extend are parallel or substantially parallel to each other; and
an electrode finger pitch in the IDT electrode and an electrode finger pitch in the comb-shaped capacitive electrode are mutually different.

5. The filter module according to claim 1, further comprising:
an antenna; wherein
the filter is a reception filter that allows high-frequency reception signals received from the antenna to be transferred to a radio frequency integrated circuit.

6. The filter module according to claim 5, the inductor is a matching circuit to match impedance of the antenna and impedance of the filter, and is connected to the filter and the antenna.

7. The filter module according to claim 1, wherein the first wiring and the second wiring are capacitively coupled with parasitic capacitance disposed therebetween.

8. The filter module according to claim 1, wherein the first wiring and the second wiring are parallel or substantially parallel to each other.

9. The filter module according to claim 1, further comprising:
a mounting substrate; wherein
the filter includes a piezoelectric substrate;
the inductor and the piezoelectric substrate are mounted on the mounting substrate; and
the second wiring is provided on an end portion of the piezoelectric substrate near the inductor.

10. The filter module according to claim 1, further comprising:
a plurality of filters including the filter; wherein
input terminals or output terminals of the plurality of filters are connected to a common terminal.

11. The filter module according to claim 1, wherein the inductor is a chip inductor.

12. The filter module according to claim 1, wherein the filter has a pass band of about 859 MHz to about 894 MHz and an attenuation band of about 814 MHz to about 849 MHz.

13. The filter module according to claim 1, wherein the first wiring and the second wiring are capacitively coupled with a plurality of capacitors therebetween.

14. The filter module according to claim 1, wherein the filter includes series arm resonators, parallel arm resonators, a longitudinally coupled resonator, and a capacitor.

* * * * *